United States Patent
Lof et al.

(10) Patent No.: US 8,344,341 B2
(45) Date of Patent: Jan. 1, 2013

(54) LITHOGRAPHIC APPARATUS AND DEVICE MANUFACTURING METHOD

(75) Inventors: Joeri Lof, Eindhoven (NL); Joannes Theodoor De Smit, Waalre (NL); Roelof Aeilko Siebrand Ritsema, Eindhoven (NL); Klaus Simon, Eindhoven (NL); Theodorus Marinus Modderman, Nuenen (NL); Johannes Catharinus Hubertus Mulkens, Valkenswaard (NL); Hendricus Johannes Maria Meijer, Veldhoven (NL); Erik Roelof Loopstra, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 12/853,030

(22) Filed: Aug. 9, 2010

(65) Prior Publication Data

US 2011/0027721 A1 Feb. 3, 2011

Related U.S. Application Data

(60) Division of application No. 12/318,036, filed on Dec. 19, 2008, now Pat. No. 7,795,603, which is a continuation of application No. 11/371,235, filed on Mar. 9, 2006, now Pat. No. 7,482,611, which is a continuation of application No. 10/705,816, filed on Nov. 12, 2003, now Pat. No. 7,193,232.

(30) Foreign Application Priority Data

Nov. 12, 2002 (EP) .................................... 02257822
Jun. 11, 2003 (EP) .................................... 03253692

(51) Int. Cl.
*G01N 21/86* (2006.01)
*A61N 5/00* (2006.01)
*G03B 27/42* (2006.01)
(52) U.S. Cl. .................. 250/548; 250/492.1; 355/53
(58) Field of Classification Search .......... 250/573–577, 250/548, 492.1, 492.2, 559.29, 559.4; 355/53, 355/69, 30, 55, 56, 67, 71–75; 356/399–402
See application file for complete search history.

(56) References Cited

U.S. PATENT DOCUMENTS

| | | |
|---|---|---|
| 3,573,975 A | 4/1971 | Dhaka et al. |
| 3,648,587 A | 3/1972 | Stevens |
| 4,346,164 A | 8/1982 | Tabarelli et al. |

(Continued)

FOREIGN PATENT DOCUMENTS

DE 206 607 2/1984

(Continued)

OTHER PUBLICATIONS

B.J. Lin, "Drivers, Prospects and Challenges for Immersion Lithography", TSMC, Inc., Sep. 2002.

(Continued)

*Primary Examiner* — Georgia Y Epps
*Assistant Examiner* — Don Williams
(74) *Attorney, Agent, or Firm* — Pillsbury Winthrop Shaw Pittman LLP (57) ABSTRACT

A map of the surface of a substrate is generated at a measurement station. The substrate is then moved to where a space between a projection lens and the substrate is filled with a liquid. The substrate is then aligned using, for example, a transmission image sensor and, using the previous mapping, the substrate can be accurately exposed. Thus the mapping does not take place in a liquid environment.

9 Claims, 4 Drawing Sheets

U.S. PATENT DOCUMENTS

| | | | |
|---|---|---|---|
| 4,390,273 A | 6/1983 | Loebach et al. | |
| 4,396,705 A | 8/1983 | Akeyama et al. | |
| 4,480,910 A | 11/1984 | Takanashi et al. | |
| 4,509,852 A | 4/1985 | Tabarelli et al. | |
| 4,999,669 A | 3/1991 | Sakamoto et al. | |
| 5,040,020 A | 8/1991 | Rauschenbach et al. | |
| 5,121,256 A | 6/1992 | Corle et al. | |
| 5,229,872 A | 7/1993 | Mumola | |
| 5,231,291 A * | 7/1993 | Amemiya et al. | 250/443.1 |
| 5,296,891 A | 3/1994 | Vogt et al. | |
| 5,523,193 A | 6/1996 | Nelson | |
| 5,610,683 A * | 3/1997 | Takahashi | 355/53 |
| 5,648,854 A | 7/1997 | McCoy et al. | |
| 5,715,039 A | 2/1998 | Fukuda et al. | |
| 5,825,043 A | 10/1998 | Suwa | |
| 5,900,354 A | 5/1999 | Batchelder | |
| 5,969,441 A | 10/1999 | Loopstra et al. | |
| 6,046,792 A | 4/2000 | Van Der Werf et al. | |
| 6,051,843 A | 4/2000 | Nishi | |
| 6,144,719 A | 11/2000 | Hasegawa et al. | |
| 6,191,429 B1 | 2/2001 | Suwa | |
| 6,236,634 B1 | 5/2001 | Lee et al. | |
| 6,521,900 B1 | 2/2003 | Hirayanagi | |
| 6,560,032 B2 | 5/2003 | Hatano | |
| 6,600,547 B2 | 7/2003 | Watson et al. | |
| 6,603,130 B1 | 8/2003 | Bisschops et al. | |
| 6,633,365 B2 | 10/2003 | Suenaga | |
| 6,710,849 B2 | 3/2004 | Kwan et al. | |
| 6,788,385 B2 | 9/2004 | Tanaka et al. | |
| 6,788,477 B2 | 9/2004 | Lin | |
| 6,867,844 B2 | 3/2005 | Vogel et al. | |
| 6,952,253 B2 | 10/2005 | Lof et al. | |
| 7,009,682 B2 | 3/2006 | Bleeker | |
| 7,075,616 B2 | 7/2006 | Derksen et al. | |
| 7,081,943 B2 | 7/2006 | Lof et al. | |
| 7,110,081 B2 | 9/2006 | Hoogendam et al. | |
| 7,199,858 B2 | 4/2007 | Lof et al. | |
| 7,359,030 B2 | 4/2008 | Simon et al. | |
| 7,394,521 B2 | 7/2008 | Van Santen et al. | |
| 7,411,657 B2 | 8/2008 | Ottens et al. | |
| 7,978,306 B2 | 7/2011 | Ottens et al. | |
| 2002/0020821 A1 | 2/2002 | Van Santen et al. | |
| 2002/0063856 A1 | 5/2002 | Inoue | |
| 2002/0163629 A1 | 11/2002 | Switkes et al. | |
| 2002/0171818 A1 * | 11/2002 | Minnaert et al. | 355/69 |
| 2003/0123040 A1 | 7/2003 | Almogy | |
| 2003/0174408 A1 | 9/2003 | Rostalski et al. | |
| 2003/0213921 A1 * | 11/2003 | Van De Moosdijk et al. | 250/492.1 |
| 2004/0000627 A1 | 1/2004 | Schuster | |
| 2004/0021844 A1 | 2/2004 | Suenaga | |
| 2004/0041104 A1 * | 3/2004 | Liebregts et al. | 250/492.22 |
| 2004/0075895 A1 | 4/2004 | Lin | |
| 2004/0109237 A1 | 6/2004 | Epple et al. | |
| 2004/0119954 A1 | 6/2004 | Kawashima et al. | |
| 2004/0125351 A1 | 7/2004 | Krautschik et al. | |
| 2005/0052632 A1 | 3/2005 | Miyajima | |
| 2005/0110973 A1 | 5/2005 | Streefkerk et al. | |
| 2005/0132914 A1 | 6/2005 | Mulkens et al. | |
| 2005/0200815 A1 | 9/2005 | Akamatsu | |
| 2005/0219489 A1 | 10/2005 | Nei et al. | |
| 2006/0023186 A1 | 2/2006 | Binnard | |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 0502583 | 9/1992 |
| EP | 1037117 A2 | 9/2000 |
| EP | 1039511 | 9/2000 |
| EP | 0906590 | 8/2003 |
| EP | 1 477 856 A1 | 11/2004 |
| EP | 1 571 696 A1 | 9/2005 |
| EP | 1 628 329 A1 | 2/2006 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 6-084757 | 3/1994 |
| JP | 06-124873 | 5/1994 |
| JP | 6-168866 | 6/1994 |
| JP | 07-132262 | 5/1995 |
| JP | 07-220990 | 8/1995 |
| JP | 10-154669 | 6/1998 |
| JP | 10-214783 | 8/1998 |
| JP | 10-228661 | 8/1998 |
| JP | 10-255319 | 9/1998 |
| JP | 10-303114 | 11/1998 |
| JP | 10-340846 | 12/1998 |
| JP | 11-126112 | 5/1999 |
| JP | 11-176727 | 7/1999 |
| JP | 2000-058436 | 2/2000 |
| JP | 2001-091849 | 4/2001 |
| JP | 2002358556 | 12/2002 |
| JP | 2004-193252 | 7/2004 |
| JP | 2005-012201 | 1/2005 |
| JP | 1571697 | 7/2005 |
| JP | 2005-277363 | 10/2005 |
| WO | 9833096 | 7/1998 |
| WO | 9838597 | 9/1998 |
| WO | 9840791 | 9/1998 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/095135 | 11/2004 |
| WO | WO 2004/102646 | 11/2004 |
| WO | WO 2005/031799 | 4/2005 |
| WO | WO 2005/036624 | 4/2005 |
| WO | WO 2005/074014 | 8/2005 |

OTHER PUBLICATIONS

B.J. Lin, "Proximity Printing Through Liquid", IBM Technical Disclosure Bulletin, vol. 20, No. 11B, Apr. 1978, p. 4997.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

T. Matsuyama et al., "Nikon Projection Lens Update", SPIE Microlithography 2004, 5377-65, Mar. 2004.

European Search Report for EP Application No. 03257072.3, dated Jun. 23, 2005.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

Japanese Office Action issued or Japanese Patent Application No. 2003-381339, dated Oct. 18, 2006.

M. Switkes et al., "Immersion Lithography at 157 nm", MIT Lincoln Lab, Orlando Jan. 2001, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "The PathS to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future FAB International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

Japanese Offfice Action issued for Japanese Patent Application No. 2003-381339, dated Jun. 6, 2007.

Examination Report for Application No. 03 257 072.3 dated Mar. 28, 2008.

Office Action in related application EPO3 257 071.5 mailed Dec. 7, 2009.

U.S. Appl. No. 60/462,499, titled Landing Pad for Immersion Lithography, filed Apr. 11, 2003 in the United States Patent and Trademark Office.

Chinese Office Action dated Dec. 7, 2011 in corresponding Chinese Patent Application No. 200910002111.5.

European Examination Report dated Apr. 12, 2012 in corresponding European Patent Application No. 03 257 070.7.

Japanese Office Action mailed Jul. 24, 2012 in corresponding Japanese Patent Application No. 2011-243516.

U.S. Office Action mailed May 24, 2012 in corresponding U.S. Appl. No. 12/512,754.

U.S. Office Action mailed Jun. 8, 2012 in corresponding U.S. Appl. No. 13/149,404.

U.S. Office Action mailed Jun. 14, 2012 in corresponding U.S. Appl. No. 12/698,938.

U.S. Office Action mailed Sep. 25, 2012 in corresponding U.S. Appl. No. 12/850,472.

U.S. Office Action mailed Sep. 27, 2012 in corresponding U.S. Appl. No. 12/698,932.

U.S. Office Action mailed Oct. 15, 2012 in corresponding U.S. Appl. No. 13/149,404.

U.S. Office Action mailed Oct. 24, 2012 in corresponding U.S. Appl. No. 12/512,754.

U.S. Office Action mailed Nov. 26, 2012 in corresponding U.S. Appl. No. 12/698,938.

\* cited by examiner

LITHOGRAPHIC APPARATUS AND DEVICE MANUFACTURING METHOD

This application is a divisional of co-pending U.S. patent application Ser. No. 12/318,036, filed Dec. 19, 2008 now U.S. Pat. No. 7,795,603, which is a continuation of U.S. patent application Ser. No. 11/371,235, filed Mar. 9, 2006, now U.S. Pat. No. 7,482,611, issued on Jan. 27, 2009, which is a continuation of U.S. application Ser. No. 10/705,816, filed Nov. 12, 2003, now U.S. Pat. No. 7,193,232, issued on Mar. 20, 2007, which claims priority from European patent applications EP 02257822.3, filed Nov. 12, 2002, and EP 03253692.2, filed Jun. 11, 2003, all the foregoing applications herein incorporated in their entirety by reference.

FIELD

The present invention relates to immersion lithography.

BACKGROUND

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such a patterning device include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer. LCD, mask etc) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference in their entirety.

The lithographic industry is constantly trying to reduce feature sizes on silicon substrates in order to manufacture ever more complex integrated circuits. The feature sizes are limited by the effect of diffraction and thus the resolution of a particular system of numeral aperture NA using a wavelength λ is:

$$W = k\frac{\lambda}{NA}$$

where k is a pre-factor. The numerical aperture NA is n sin θ where n is the refractive index of the transmissive substance.

Hence to decrease the resolution, the wavelength can either be reduced or the numerical aperture increased. It has been proposed to immerse the substrate in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system).

However, submersing the substrate or substrate and substrate table in a bath of liquid (see for example U.S. Pat. No. 4,509,852, hereby incorporated in its entirety by reference) may mean that there is a large body of liquid that must be accelerated during a scanning exposure. This may require additional or more powerful motors and turbulence in the liquid may lead to undesirable and unpredictable effects.

Figure 4:
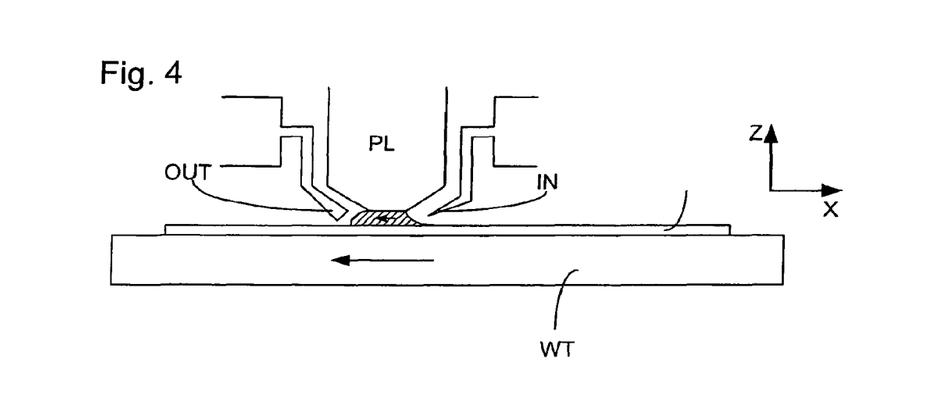
FIG. 4 depicts an alternative liquid supply system according to an embodiment of the invention.
Figure 5:
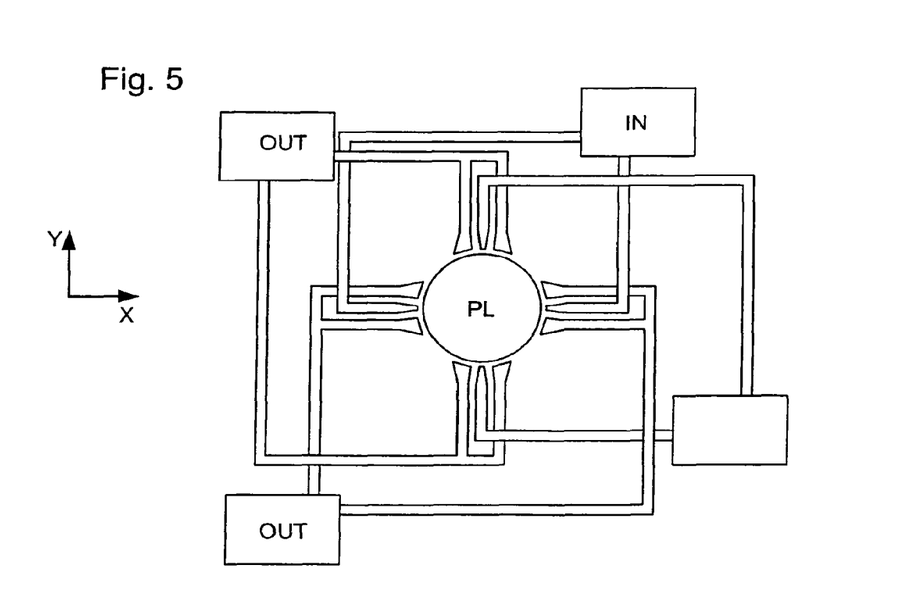
FIG. 5 is an alternative view of the liquid supply system of FIG. 4 according to an embodiment of the invention.

One of the solutions proposed is for a liquid supply system to provide liquid in a localized area between the final element of the projection system and the substrate (the substrate generally has a larger surface area than the final element of the projection systems). One way which has been proposed to arrange for this is disclosed in PCT patent application WO 99/49504, hereby incorporated in its entirety by reference. As illustrated in FIGS. 4 and 5, liquid is supplied by at least one inlet IN onto the substrate, preferably along the direction of movement of the substrate, relative to the final element, and is removed by at least one outlet OUT after having passed under the projection system. That is, as the substrate is scanned beneath the element in a −X direction, liquid is supplied at the +X side of the element and taken up at the −X side. FIG. 4 shows the arrangement schematically in which liquid is supplied via inlet IN and is taken up on the other side of the element by outlet OUT which is connected to a low pressure source. In the illustration of FIG. 4 the liquid is supplied along the direction of movement of the substrate relative to the final element, though this does not need to be the case. Various orientations and numbers of in and out-lets positioned around the final element are possible, one example is illustrated in FIG. 5 in which four sets of an inlet with an outlet on either side are provided in a regular pattern around the final element to form a liquid reservoir.

SUMMARY

Immersion lithography is an embryonic technology and there remain many problems in its practical application. This patent application is concerned in particular with alignment and leveling of a substrate. Conventionally alignment and leveling is performed with the substrate in the field of view of the projection system (i.e. at an exposure station). However there is not a lot of space for alignment or level measurement apparatus in and around an immersion liquid reservoir so the adaptation is likely to be complex or the accuracy can be compromised. Furthermore, the presence of liquid near the alignment and level measurement apparatus can degrade the performance of the apparatus.

Accordingly, it may be advantageous to provide, for example, a method and apparatus for accurately aligning and/or leveling a substrate in an immersion lithography apparatus.

According to an aspect, there is provided a lithographic projection apparatus comprising:

a support structure configured to hold a patterning device, the patterning device configured to pattern a beam of radiation according to a desired pattern;

a substrate table configured to hold a substrate;

a projection system configured to project the patterned beam onto a target portion of the substrate;

a liquid supply system configured to provide a liquid, through which said beam is to be projected, in a space between said projection system and said substrate; and a measurement system configured to measure, not through said liquid, locations of points on said substrate.

The position of points on the substrate are thus measured without the presence of liquid and, in an embodiment, outside the immersion system. Alternatively, the measurements could take place while a target portion of the substrate is submerged in liquid, i.e. the measurements take place through liquid, but not the same liquid as supplied by the liquid supply system to fill a space between the projection system and the substrate. The position of points on the substrate would therefore be measured with liquid between the measurement system and the substrate, the liquid would then be removed before moving the substrate (and substrate table) to the focal point of the projection system where the liquid supply system would supply liquid to fill a space between the projection system and the substrate prior to exposure taking place. A second liquid supply system may be present in the vicinity of the measurement system.

A possible advantage is that there is better flow in the liquid reservoir because the measurement system is no longer in or around the reservoir crowding the projection system and the performance of the measurement system is not degraded by the presence of liquid. Furthermore smooth flow conditions in the liquid reservoir are desired as there is no change in the apparatus leading to rough edges. Using this method, measurement systems not specifically adapted for immersion lithography can be used without complex adaptation. A further advantage of this measurement system is that any improvements to such measurement systems used outside of the immersion lithography field can easily and automatically be incorporated into the immersion system.

The measurement system, in an embodiment, comprises an alignment system configured to measure the location (in the x, y and $R_z$ directions) of a plurality of alignment marks on said substrate. According to an embodiment, said substrate table has a reference and said measurement system measures the location of said reference not through said liquid of said supply system. The location of the alignment marks may in an embodiment be measured relative to said reference on said substrate table to enable a map of alignment marks relative to the reference to be built up.

According to an embodiment, the measurement system comprises a level sensor configured to measure the height and/or tilt (i.e. measuring in the z, $R_x$ and $R_y$ directions) of points on said substrate. Thus, level measurement of the substrate, which is conventionally undertaken "on-the-fly" at the exposure station, can be achieved outside the liquid reservoir.

In an embodiment, the lithographic projection apparatus can have an exposure station at which said substrate may be exposed and a separate measurement station, said measurement system being provided at said measurement station and said substrate table being movable between said exposure and measurement stations. Furthermore, there can be a plurality of substrate tables, each movable between an exposure station and a measurement station. While one substrate table is being mapped, a second substrate table can be exposed. Substrate throughput may therefore be increased, making the apparatus more efficient and improving the cost of ownership.

According to an embodiment, said reference is a transmission image sensor.

In an embodiment, the alignment system measures displacement in two linear perpendicular directions and rotation within the plane defined by the two perpendicular directions.

In an embodiment, said liquid supply system is configured to provide said liquid to a space between a final lens of said projection system and said substrate.

According to a further aspect, there is provided a device manufacturing method comprising:

providing a liquid in a space between a projection system and a substrate;

measuring the locations of points on a substrate using a measurement beam projected from a measurement system but not projected through said liquid; and projecting a patterned beam of radiation, through said liquid, onto a target portion of the substrate using the projection system.

Although specific reference may be made in this text to the use of the apparatus described herein in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm).

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
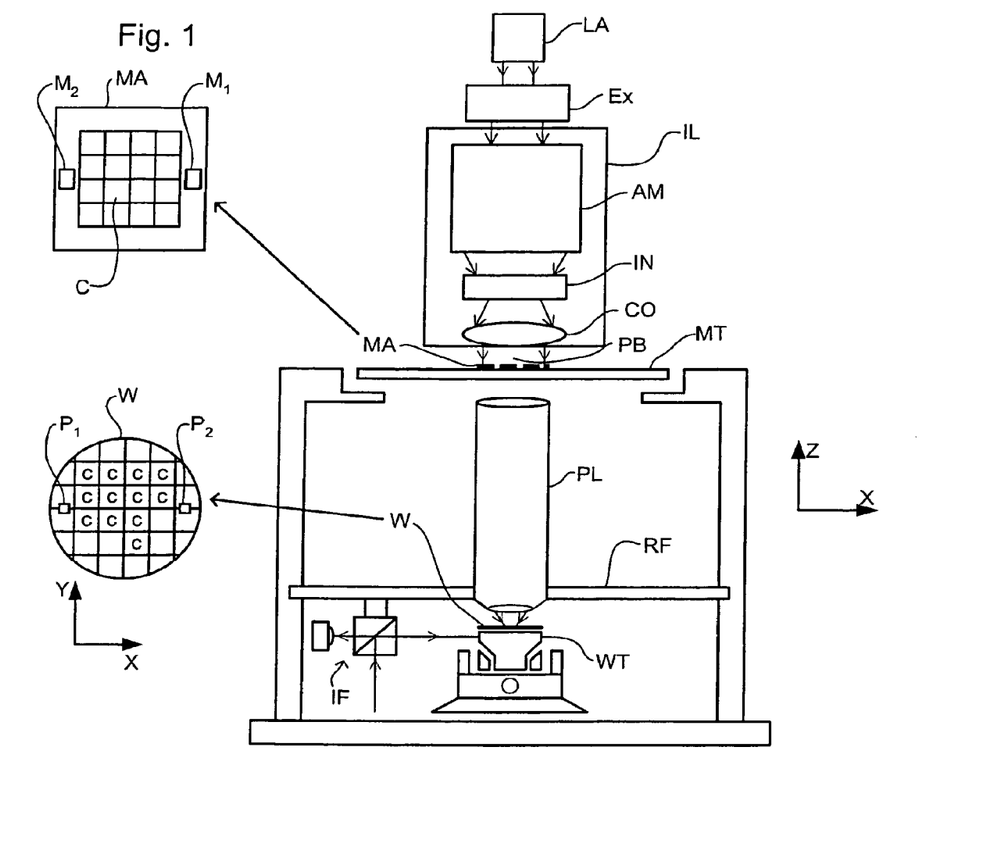
FIG. 1 depicts a lithographic projection apparatus according to an embodiment of the invention.

FIG. 1 schematically depicts a lithographic projection apparatus according to a particular embodiment of the invention. The apparatus comprises:

a radiation system Ex, IL, for supplying a projection beam PB of radiation (e.g. UV radiation), which in this particular case also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive lens system) for imaging an irradiated portion of the mask MA onto a target portion C (e.g. comprising one or more dies) of the substrate W.

As here depicted, the apparatus is of a transmissive type (e.g. has a transmissive mask). However, in general, it may also be of a reflective type, for example (e.g. with a reflective mask). Alternatively, the apparatus may employ another kind of patterning device, such as a programmable mirror array of a type as referred to above.

The source LA (e.g. a laser-produced or discharge plasma source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the projection system PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed in the XY plane.

The depicted apparatus can be used in two different modes:

1. In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the projection system PL (typically, M=¼ or ⅕). In this manner, a relatively large target portion C can be exposed, without having to compromise on resolution.

Figure 2:
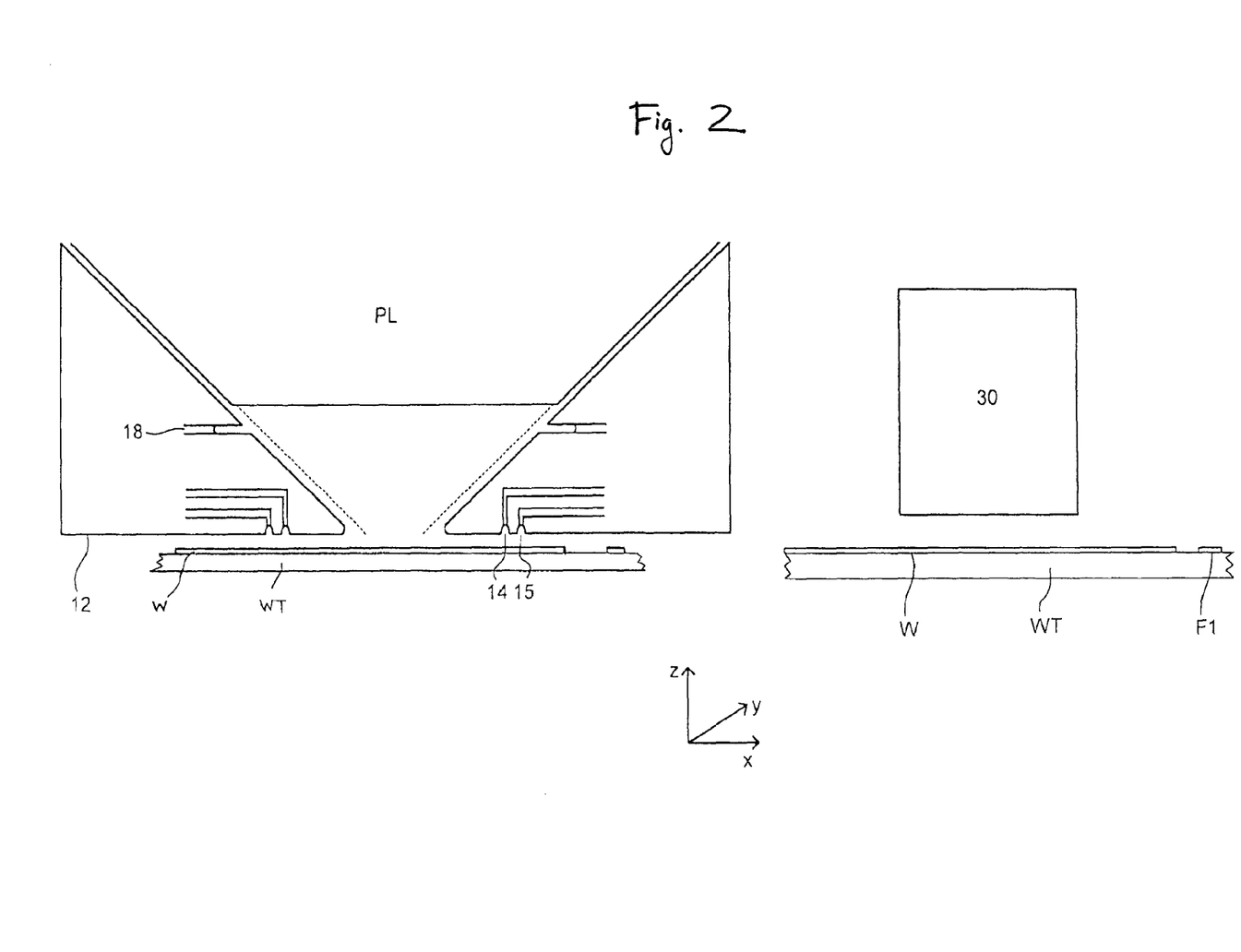
FIG. 2 depicts a detail of a lithographic projection apparatus according to an embodiment of the invention.

In FIG. 2 the substrate table WT is at a measurement station where alignment and/or level measurement take place. The substrate table is provided with a reference F1, sometimes referred to as a fiducial, which can comprise a plate etched through with a pattern corresponding to a standard alignment mark underneath which is a radiation sensor, also known as a transmission image sensor, responsive to radiation. At the measurement station, the substrate table WT is moved to detect the reference F1 using an alignment system within the measurement system 30 and then to detect the alignment marks on the substrate W thereby enabling the location (in directions x, y and $R_z$) of the substrate alignment marks to be found. In an embodiment, the location of the alignment marks are measured and determined relative to the reference.

Level measurement of the substrate then occurs at the measurement station. In order to measure the level of the substrate, a leveling beam (projected from the measurement system 30) can be used that traverses a first grating prior to reflection by the substrate W. A second grating is then placed in the path of the leveling beam after reflection by the substrate W. The extent to which the images of the first and second gratings coincide is measured by a level measurement sensor and is determined by the height and/or tilts of the substrate W (the z, $R_x$ and $R_y$ coordinates are thus determined). For a further description of level measurement of substrates reference is made to European patent application EP 0502583. Hence, using data from the alignment of the substrate and the level measurement of the substrate, a map of the substrate can be generated.

Figure 3:
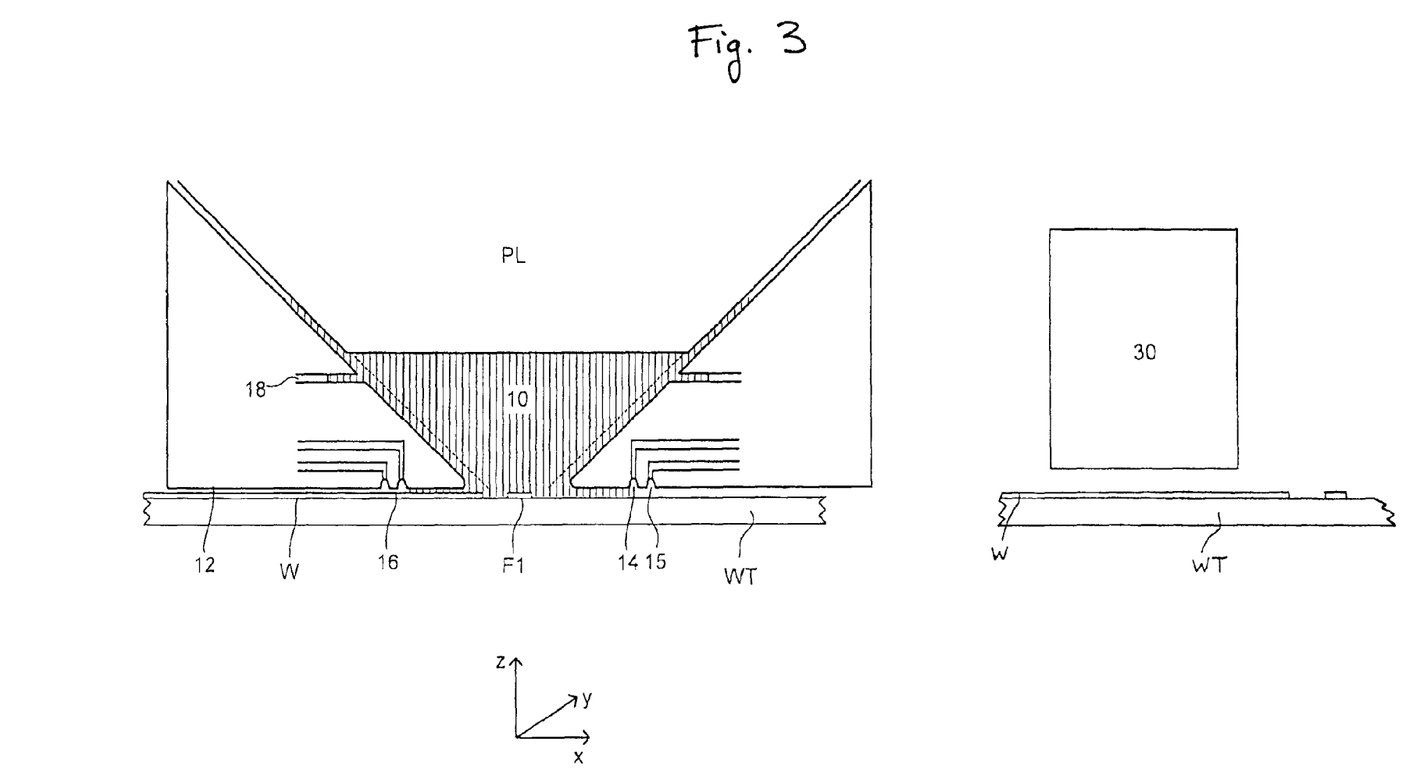
FIG. 3 depicts the same details of the lithographic projection apparatus as FIG. 2 at a different stage in the exposure process according to an embodiment of the invention.

As shown in FIG. 3, substrate table WT is then moved to the separate exposure station where a liquid supply 18 is provided to supply liquid (e.g. water) to a space between the projection system PL and the substrate table WT to form a liquid reservoir 10. In this example, the reservoir 10 forms a contactless seal to the substrate around the image field of the projection system PL so that liquid is confined to fill a space between the substrate surface and the final element of the projection system PL. A seal member 12, positioned below and surrounding the final element of the projection system PL, borders the reservoir 10 and comprises the liquid supply 18. The seal member 12 extends a little above the final element of the projection system and has an inner periphery that at the upper end closely conforms to the step of the projection system or the final element thereof and may, e.g., be round. At the bottom, the inner periphery closely conforms to the shape of the image field, e.g., rectangular though this need not be the case. Liquid is brought into the space below the projection system and within the seal member 12 and the liquid level rises above the final element of the projection system PL so that a buffer of liquid is provided.

A gas seal 16, formed between the bottom of the seal member 12 and the surface of the substrate W, confines the liquid in the reservoir. The gas seal is formed by gas, e.g. air or synthetic air but in an embodiment, $N_2$ or another inert gas, provided under pressure via inlet 15 to the gap between seal member 12 and the substrate W and extracted via first outlet 14. An overpressure on the gas inlet 15, vacuum level on the first outlet 14 and geometry of the gap are arranged so that there is a high-velocity gas flow inwards that confines the liquid.

In an embodiment, the liquid reservoir defined by inlet(s) IN and outlet(s) OUT as shown in FIGS. 4 and 5 can be similarly applied. In such a case, a measurement station can be provided as well as an exposure station comprising inlet(s) IN and outlet(s) OUT.

To ascertain the exact position of the substrate table WT at the exposure station the reference F1 is scanned in three dimensions through the aerial image of an alignment mark on the mask MA. The maximum signal is returned when the reference is aligned with the image of the mark on the mask in the plane of best focus. Using the map of the substrate W generated at the measurement station, the location, height and/or tilt of positions on the substrate W are therefore known. In order to track the movements of the substrate table WT, suitable position measurements devices can be used such as an interferometer beam projected towards one or more sides of the substrate table WT. A particular point on the substrate table can be placed at the focal point of the projection system PL and exposure of a target portion C of the substrate W can take place.

Once exposure of the substrate W is completed it is then removed for further processing and a new substrate placed on substrate table WT. The substrate table with the new substrate returns to the measurement station and the process can be repeated.

Prior to the substrate table WT leaving the exposure station, the liquid reservoir can be emptied, for example in the case shown in FIGS. 2 and 3, by reducing the gas inlet pressure and allowing the liquid to be sucked out by the vacuum system or, for example in the case shown in FIGS. 4 and 5, by discontinuing flow of liquid onto the substrate through inlet IN and allowing the liquid to be sucked out by outlet OUT.

To ascertain the exact position of the substrate table WT, the position of the transmission image sensor described above can be sensed through the liquid, or alternatively not through the liquid and a correction applied.

According to an embodiment, there are at least two substrate tables, each bearing a reference, and while one substrate table is at the measurement station the other is at the exposure station. The substrate tables are movable between an exposure station and a measurement station.

Instead of using the reference mark F1 and the projection system to align the substrate, off-axis measurement can be used. The reference mark F1 can be aligned using another system near the projection system PL. Alternatively, a different reference and a different system, for example one with an axis perpendicular to the projection axis of the projection system can be used. Further description of such off-axis measurement can be found in European patent application publication EP 0906590.

Alternatively, if the substrate table is above the projection system (i.e. the projection system is upside down compared to FIG. 1) the liquid in liquid reservoir 10 may not need to be completely removed and could just be refilled as necessary.

In an alternative detection embodiment, there is no separate measurement station. Detection and measurement of an alignment mark takes place at the exposure station but with no liquid in reservoir 10. The liquid reservoir 10 is then filled up and exposure takes place. Similarly level measurement can take place at the exposure station with no liquid in reservoir 10. These measurements can be either off-axis or on-axis.

While specific embodiments of the invention have been described above, it will be appreciated that the invention may be practiced otherwise than as described. The description is not intended to limit the invention.

The invention claimed is:

1. A method of patterning a substrate, the method comprising:
   measuring a substrate using a first table, wherein the measuring is not performed through liquid adjacent to the first table;
   moving a substrate on a second, separate table into an optical path of a projection system;
   providing a liquid in a space between the projection system and the substrate; and
   projecting a patterned beam through the liquid onto a target portion of the substrate.

2. The method of claim 1, further comprising measuring a further substrate, wherein the measuring of the further substrate is not performed through liquid adjacent to the further substrate, at least partially overlapping in time with exposure of the substrate on the second table using the projection system.

3. The method of claim 1, wherein, during the projecting, liquid is in contact with a last element of the projection system and the substrate.

4. The method of claim 1, wherein the measuring includes measuring at a measurement station a height, a tilt, or both, of each of a plurality of points on the substrate.

5. The method of claim 4, wherein the measuring station is physically separated from an exposure station where the projection system is located.

6. A method of patterning a substrate, the method comprising:
   measuring a substrate with a beam of radiation, wherein the measuring beam is not transmitted through liquid adjacent to the substrate; and
   projecting a patterned beam through the liquid to expose a target portion of radiation sensitive material of the measured substrate.

7. The method of claim 6, wherein, during the projecting, liquid is in contact with a last element of a projection system and the substrate.

8. The method of claim 6, wherein the measuring includes measuring at a measurement station a height, a tilt, or both, of each of a plurality of points on the substrate.

9. The method of claim 8, wherein the measuring station is physically separated from an exposure station where a projection system configured to project the patterned beam is located.

* * * * *

UNITED STATES PATENT AND TRADEMARK OFFICE
CERTIFICATE OF CORRECTION

PATENT NO. : 8,344,341 B2
APPLICATION NO. : 12/853030
DATED : January 1, 2013
INVENTOR(S) : Joeri Lof et al.

Page 1 of 1

It is certified that error appears in the above-identified patent and that said Letters Patent is hereby corrected as shown below:

On Title page 2, Item (56) References Cited - Foreign Patent Documents, Column 2, Line 12
replace "JP  10-154669 6/1998"
with --JP  10-154659 6/1998--.

On Title page 3, Item (56) References Cited - Other Publications, Column 2, Line 32
add "EP Search Report for EP 02257938 dated September 25, 2003."

Signed and Sealed this
Twenty-sixth Day of February, 2013

Teresa Stanek Rea
*Acting Director of the United States Patent and Trademark Office*